United States Patent [19]
Silva

[11] Patent Number: 5,557,505
[45] Date of Patent: Sep. 17, 1996

[54] DUAL PATTERN MICROPROCESSOR PACKAGE FOOTPRINT

[75] Inventor: David J. Silva, Trabuco Canyon, Calif.

[73] Assignee: AST Research, Inc., Irvine, Calif.

[21] Appl. No.: 278,798

[22] Filed: Jul. 22, 1994

[51] Int. Cl.$^6$ ..................................................... H05K 1/18
[52] U.S. Cl. .................... 361/777; 361/767; 361/760; 174/260; 174/261; 29/832; 257/797; 257/792
[58] Field of Search ...................................... 361/767, 772, 361/777, 760, 773, 783; 174/250, 260, 261, 262; 29/832, 837, 840; 228/179.1, 180.1, 180.21, 180.22; 257/697, 692, 695, 700, 723, 724, 778; 439/68

[56] References Cited

U.S. PATENT DOCUMENTS

4,530,002  7/1985  Kanai ........................................ 357/68

Primary Examiner—Laura Thomas
Attorney, Agent, or Firm—Lyon & Lyon

[57] ABSTRACT

A dual footprint for servicing either of two types of microprocessor packaging systems. A first footprint capable of receiving and servicing a first type of microprocessor packaging system, for example, a tape carrier package microprocessor package, is formed within a second footprint capable of receiving and servicing a second type of microprocessor packaging system, for example, a pin grid array microprocessor package. In a preferred form, the two footprints are electrically interconnected and the first footprint is offset by a selected angle from the second footprint to allow increased connectivity between the two footprints.

32 Claims, 7 Drawing Sheets

DUAL PATTERN MICROPROCESSOR PACKAGE FOOTPRINT

DESCRIPTION

1. Field of the Invention

The field of the present invention is integrated circuit packaging footprints for use on printed circuit boards and, more particularly, footprints for receiving and servicing pin grid array (PGA) or tape carrier package (TCP) type microprocessor packages.

2. Description of the Prior Art

Figure 1:
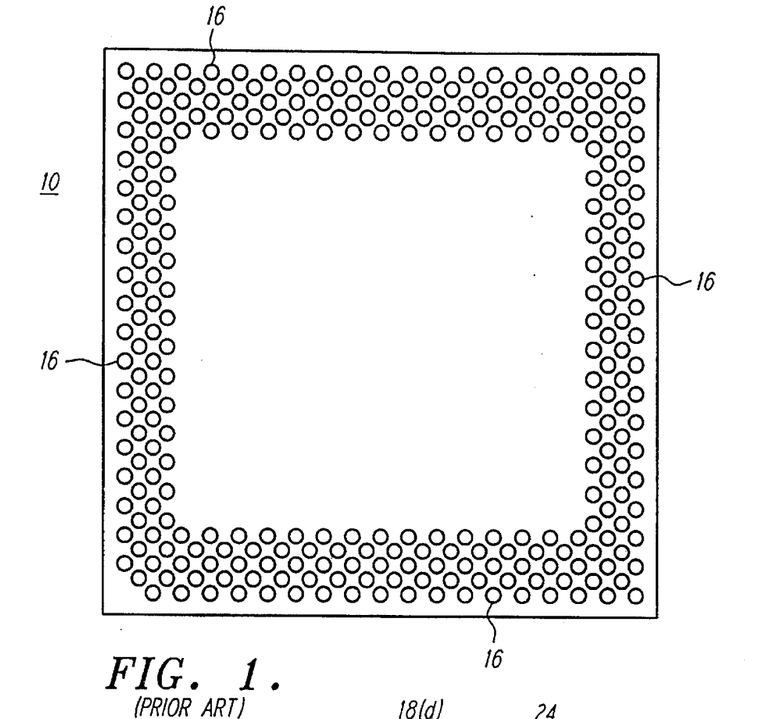
FIG. 1 is an illustration of a PC board footprint of a pin grid array (PGA) type microprocessor package.

Presently, two types of packaging systems for mounting microprocessors (for example, Intel p5c or 486 microprocessors) to a printed circuit board are preferred by the personal computer industry. The first developed, and most widely utilized, packaging system is the pin grid array (PGA) packaging system. A typical PGA package comprises a casing or housing for supporting and providing electrical connections to the pins of a microprocessor, a plurality of pins mounted to the base of the housing, and a plurality of leads for connecting selected pins of the microprocessor to selected pins of the PGA package. A typical PGA package is mounted to a printed circuit board by inserting the pins of the PGA package into a plurality of pin receptors formed within the printed circuit board. The pattern of the pin receptors formed within the printed circuit board is commonly referred to as the PGA package footprint, and an exemplary 320 pin PGA package footprint is illustrated in FIG. 1.

Figure 2:
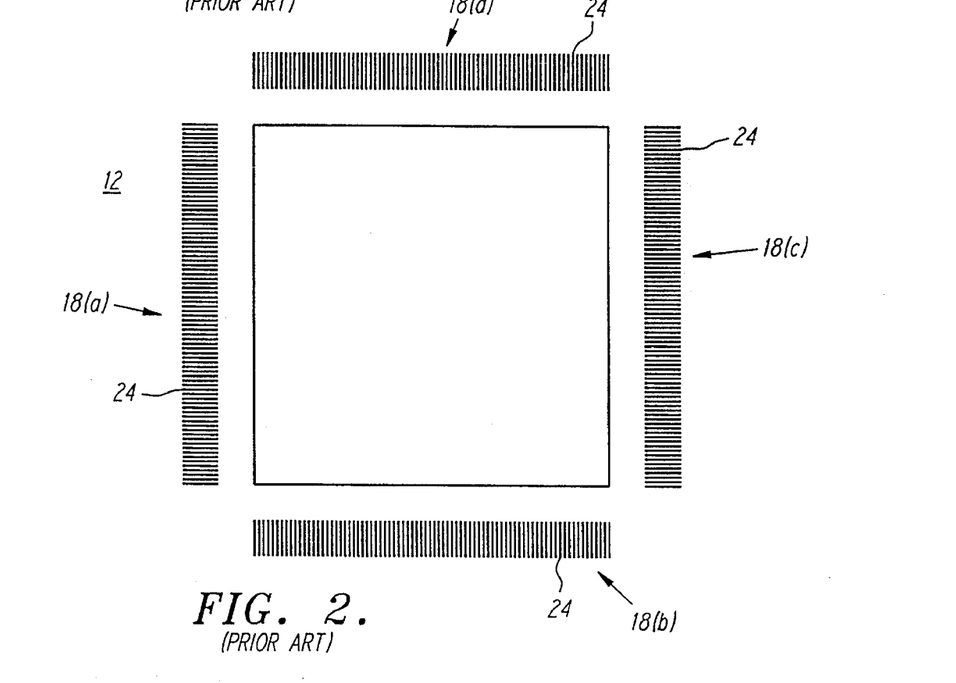
FIG. 2 is an illustration of a PC board footprint of a tape carrier package (TCP) type microprocessor package.

The second packaging system presently utilized by the personal computer industry is the tape carrier package (TCP) system. A typical TCP packaging system comprises a casing or housing for receiving and providing electrical connections to the pins of a microprocessor, a plurality of land patterns each including a plurality of exposed conductor trace segments formed on the underside of the housing, and a plurality of leads for connecting selected pins of the microprocessor to selected conductor trace segments within the land patterns. Typically, a TCP package is mounted to a printed circuit board by coupling the land patterns of the TCP package to a similar set of land patterns provided on the circuit board. The land patterns provided upon the surface of a printed circuit board are commonly referred to as a TCP package footprint. The TCP package is coupled to the circuit board via conventional means (for example, by hot bar bonding techniques). An exemplary footprint for a TCP package is illustrated in FIG. 2.

Those skilled in the art will appreciate that the personal computer manufacturing industry is highly competitive, and that profit margins are often extremely small. Indeed, system design changes capable of yielding a ½ cent per unit savings in production costs are routinely implemented to maintain a competitive market position. With such tight margins, it is readily apparent that fluctuations in the availability or cost of personal computer components may have a substantial effect on the overall profitability of a product line. For example, when large quantities of printed circuit boards are obtained for use with, for example, a PGA type microprocessor packaging system, a fluctuation in the price of PGA packaging systems or the availability of PGA packaging systems may have a profound effect on the profitability of a computer line employing those boards. Further, if PGA packaging systems cannot be obtained, new boards capable of supporting a different packaging system (for example, a TCP type packaging system) will need to be obtained, resulting not only in increased costs, but also in substantial manufacturing delays. Such a scenario is unacceptable in the highly competitive personal computer market. Accordingly, where steps can be taken to minimize and stabilize component supply costs or to insure component availability, it is often highly desirable to implement those steps in the personal computer manufacturing process.

To take advantage of, or conversely to protect against, fluctuations in the cost and availability of PGA and TCP microprocessor packaging systems, it would be desirable to provide both a PGA package footprint and a TCP package footprint on the printed circuit (PC) boards utilized by a given line of computers and, hence, to provide the capability of using either packaging system within a personal computer line. However, it will be appreciated by those skilled in the art that, if two distinct footprints are provided upon a circuit board, substantial space may be wasted on the board. This may result in increased manufacturing costs and, more importantly, may make it extremely difficult to meet board design specifications (for example, surface area restrictions).

It follows that a dual footprint for a PC board capable of receiving and servicing both TCP and PGA microprocessor packaging systems, while occupying a minimum amount of PC board space, would be quite beneficial to the personal computer manufacturing industry.

SUMMARY OF THE INVENTION

In a broad aspect, the present invention is directed to a dual footprint for use on a PC board which enables the PC board to receive one of two distinct microprocessor packages, while consuming a minimum amount of PC board area. More specifically, the present invention is directed to an innovative dual PGA and TCP footprint for use on a PC board and, hence, to a dual footprint capable of servicing either a PGA type microprocessor package or a TCP type microprocessor package. The present invention is also directed to methods for forming such a dual footprint on a PC board.

In one preferred embodiment, the dual footprint of the present invention comprises a TCP footprint disposed within a PGA footprint. It may be noted that this implementation insures that only a minimum amount of board surface area is utilized by a dual footprint in accordance with the present invention.

In another preferred embodiment, the TCP footprint is disposed within the PGA footprint and offset from the PGA footprint by a selected angle. By offsetting the TCP footprint in this fashion it is possible to minimize the number of vias and board line layers required to interconnect the TCP and PGA footprints. This implementation also makes it possible to maximize the line widths of conductor traces interconnecting the PGA and TCP footprints.

Accordingly, it is an object of the present invention to provide an improved footprint for use on PC boards and to provide improved methods for implementing the same.

It is a further object of the present invention to provide a dual footprint capable of servicing either a PGA type microprocessor package or a TCP type microprocessor package.

It is a still further object of the present invention to provide a dual footprint which consumes a minimum amount of physical board area on a PC board.

DESCRIPTION OF THE PREFERRED EMBODIMENTS

Turning now to the drawings, FIG. 1 illustrates a PC board footprint 10 of a pin grid array (PGA) type microprocessor package (not shown), and FIG. 2 illustrates a PC board footprint 12 of a tape carrier package (TCP) type microprocessor package (not shown). It may be noted that FIGS. 1 and 2 are not drawn to scale. As explained above, both TCP and PGA packages are presently employed by the personal computer manufacturing industry to attach a microprocessor (for example, an Intel p5c or 486 microprocessor) to a PC board. However, it is difficult to predict future fluctuations in both the cost and availability of these packages and, thus, it is difficult to guard against such fluctuations in cost and availability and to minimize the effect of such fluctuations on the profitability of a personal computer line. For these reasons and others which will be apparent to those skilled in the art, it is highly desirable to utilize PC boards which are capable of servicing either a PGA or TCP type of microprocessor package.

As shown in FIGS. 3, 4, 5(a) and 5(b), a dual footprint 14 in accordance with one form of the present invention provides not only the function of servicing both PGA and TCP type microprocessor packages, but also provides for a minimum utilization of physical board space. More specifically, the dual footprint 14 illustrated in FIGS. 3, 4, 5(a) and 5(b) comprises 320 pin receptors 16, four land patterns 18(a)–(d), and a plurality of vias 20. It may be noted that only representative pin receptors 16, vias 20, and conductor trace segments 24 are denoted in the drawings, as it is believed that labeling each and every pin receptor 16, via 20, and conductor trace segment 24 would unnecessarily clutter the drawings.

Figure 6:
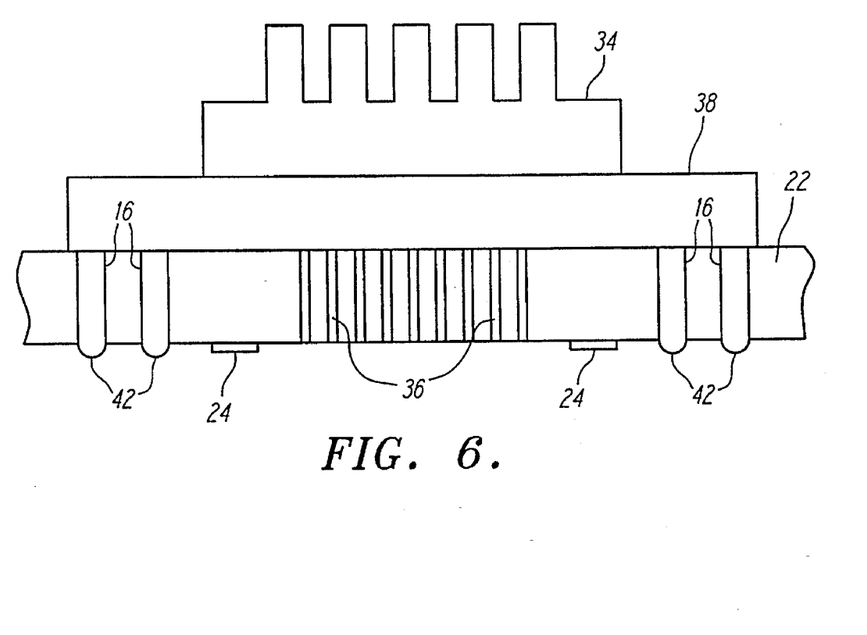
FIG. 6 is a cross-sectional view of a PGA package disposed within a dual footprint in accordance with the present invention.

The pin receptors 16 are arranged in several interspaced rows bordering a first substantially square area on a PC board 22 (shown in FIG. 6). The pin receptors 16 form a PGA footprint similar to that illustrated in FIG. 1. The land patterns 18(a)–(d) are disposed within the square area bordered by the pin receptors 16, and the land patterns 18(a)–(d) form a TCP footprint similar to that illustrated in FIG. 2. Each of the land patterns 18(a)–(d) comprises a set of 80 conductor trace segments 24 disposed one adjacent another and orthogonal to a separate side of a second substantially square area located on the PC board 22. Notably, the first and second square areas are offset by a selected angle, 10° in a preferred form, to enable increased interconnectivity between the pin receptors 16 and the trace segments 24 comprising the land patterns 18(a)–(d). Finally, selected ones of the pin receptors 16 and conductor trace segments 24 are interconnected by a plurality of conductor traces (or etches) 26 and vias 20.

Figure 3:
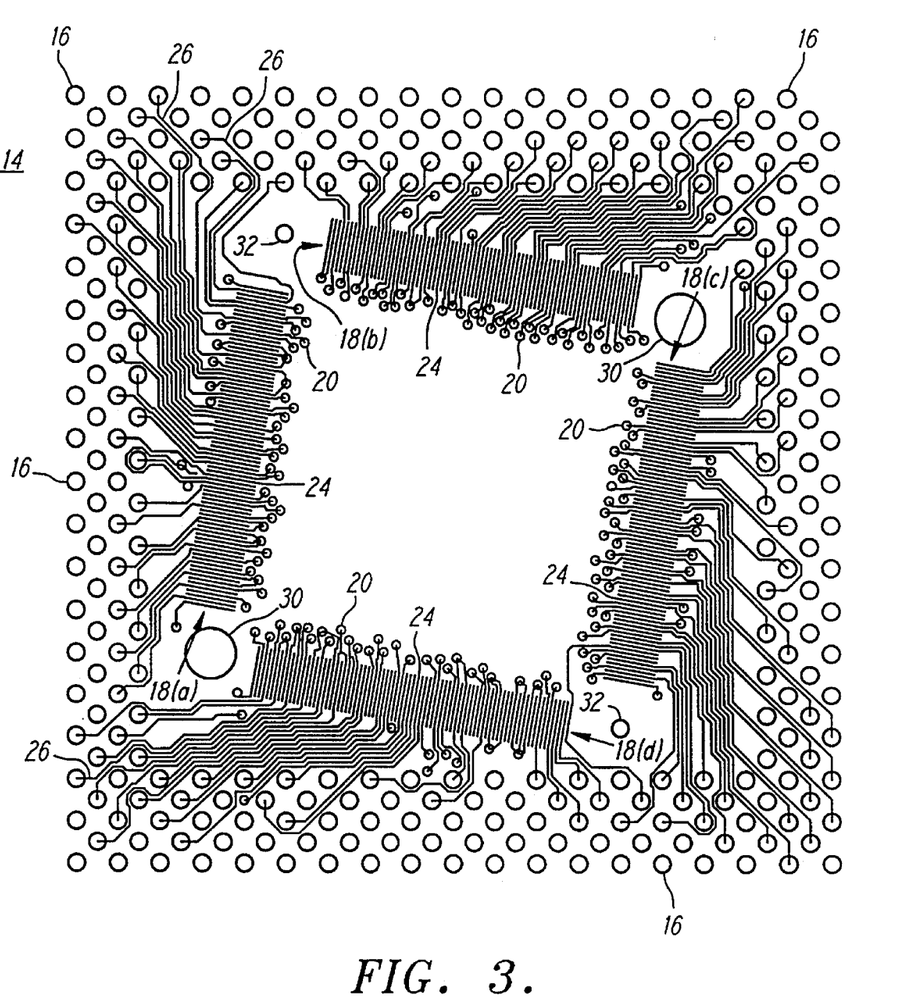
FIG. 3 is an illustration of a first PC board layer having a first portion of a dual TCP and PGA footprint formed thereon.
Figure 4:
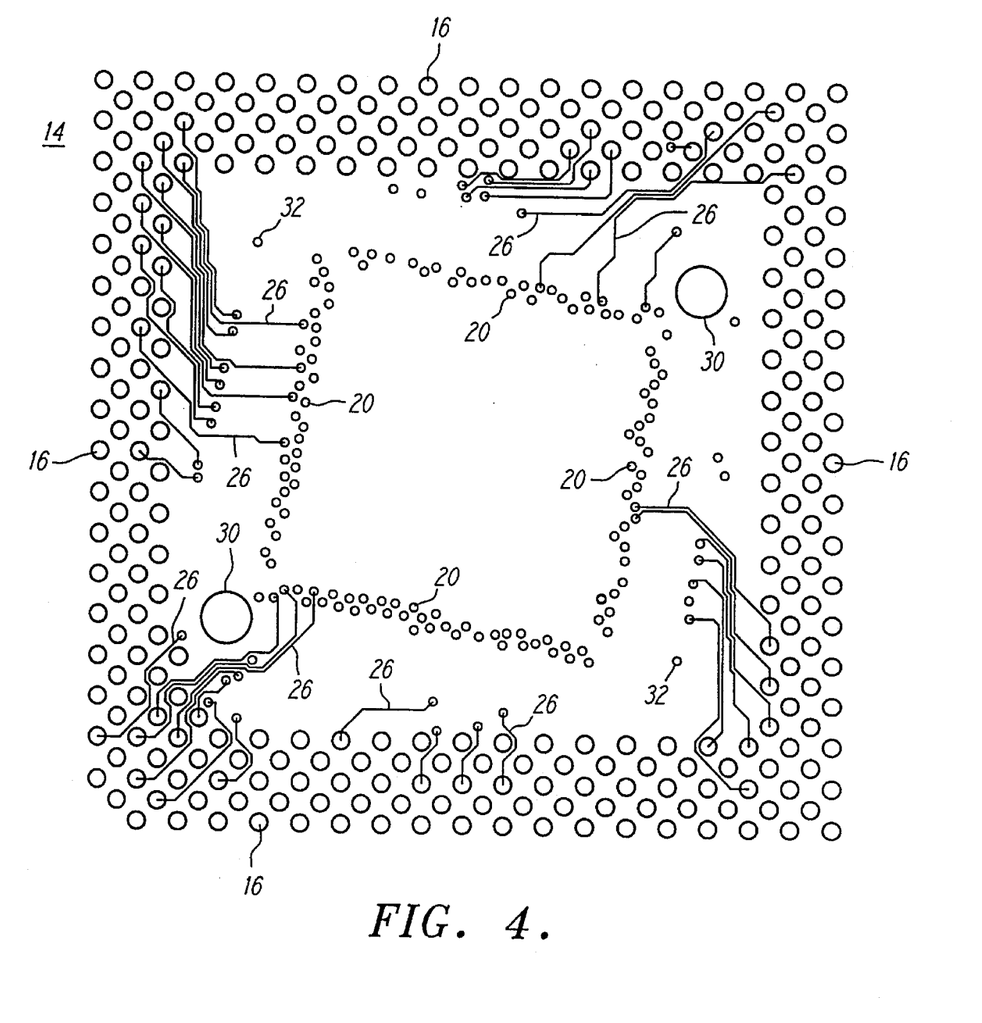
FIG. 4 is an illustration of a second PC board layer having a second portion of a dual TCP and PGA footprint formed thereon.

An exemplary pattern of connectivity between the pin receptors 16, the trace segments 24 of the land patterns 18(a)–(d), and the vias 20 is illustrated in FIGS. 3 and 4, and a preferred pattern of connectivity between pin receptors 16, the trace segments 24 of the land patterns 18(a)–18(d), and the vias 20 is illustrated in FIGS. 5(a) and 5(b). Those skilled in the art will appreciate that FIGS. 3 and 4 provide illustrations of two distinct board layers within a single PC board 22. Likewise, FIGS. 5(a) and 5(b) provide illustrations of two distinct board layers within a single PC board 22. When, configured in the manner illustrated in FIGS. 3 and 4 or 5(a) and 5(b), the dual footprint 14 is capable receiving and servicing either a PGA or TCP type microprocessor package. In addition, utilization of physical board space is minimized, and connectivity between the pin receptors 16 and the trace segments 24 of the land patterns 18(a)–(d) is enhanced. These configurations also enable the use of increased trace (or etch) widths for interconnecting the pin receptors 16 and the trace segments 24.

Those skilled in the art will appreciate that, while it may be advantageous and preferred for the PGA footprint and TCP footprint portions of the dual footprint 14 to share a common center point (not shown), the present invention need not be limited to such a configuration. Indeed, so long as the TCP portion of the dual footprint 14 is contained within a perimeter region of the PGA portion of the dual footprint 14, a minimum amount of board surface area will be consumed. It will also be appreciated that, while not necessary, it may be preferable to construct the TCP portion of the dual footprint 14 on one side of a PC board 22 and to construct the PGA portion of the dual footprint 14 on the opposite side of the PC board 22.

Figure 5:
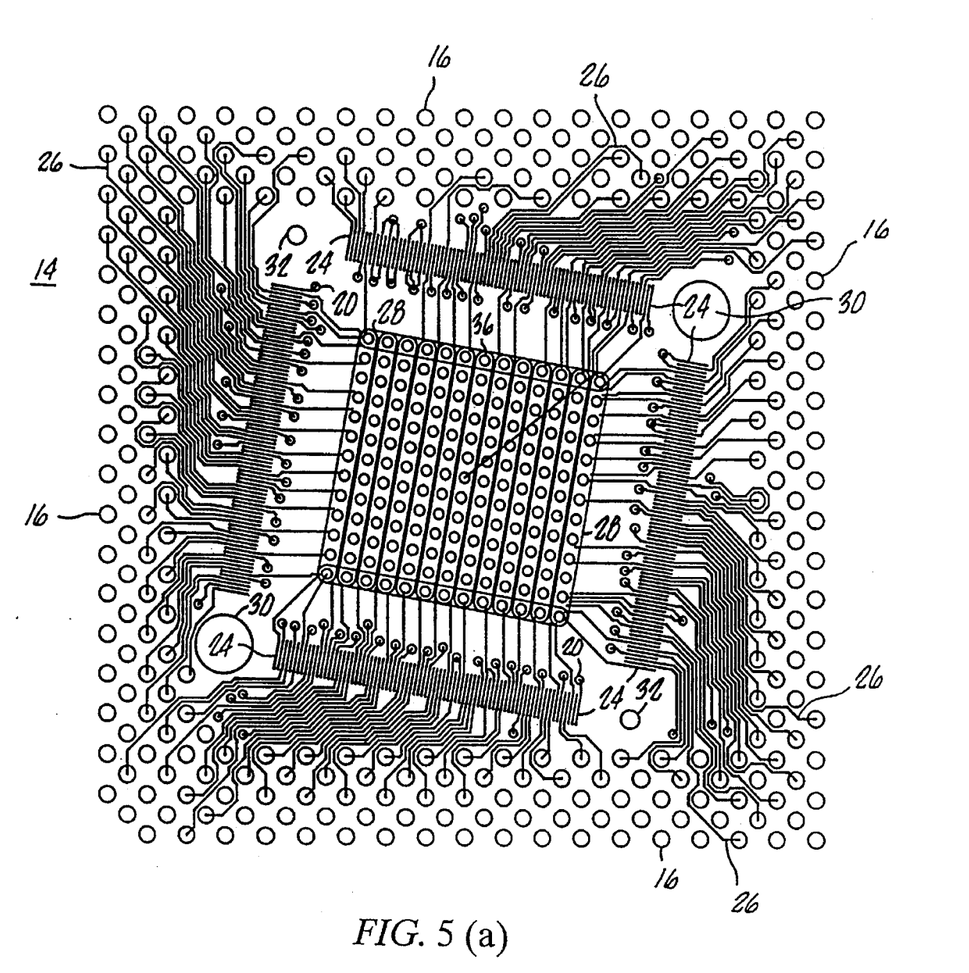
FIG. 5(a) is an illustration of a preferred configuration of a first PC board layer having a first portion of a dual TCP and PGA footprint and heat pad formed thereon.
FIG. 5(b) is an illustration of a preferred configurations of a second PC board layer having a second portion of a dual TCP and PGA footprint and heat pad formed thereon.
FIG. 5(c) is an illustration of a heat pad disposed within a TCP footprint portion of a dual footprint in accordance with a preferred form of the present invention.
Figure 5C:
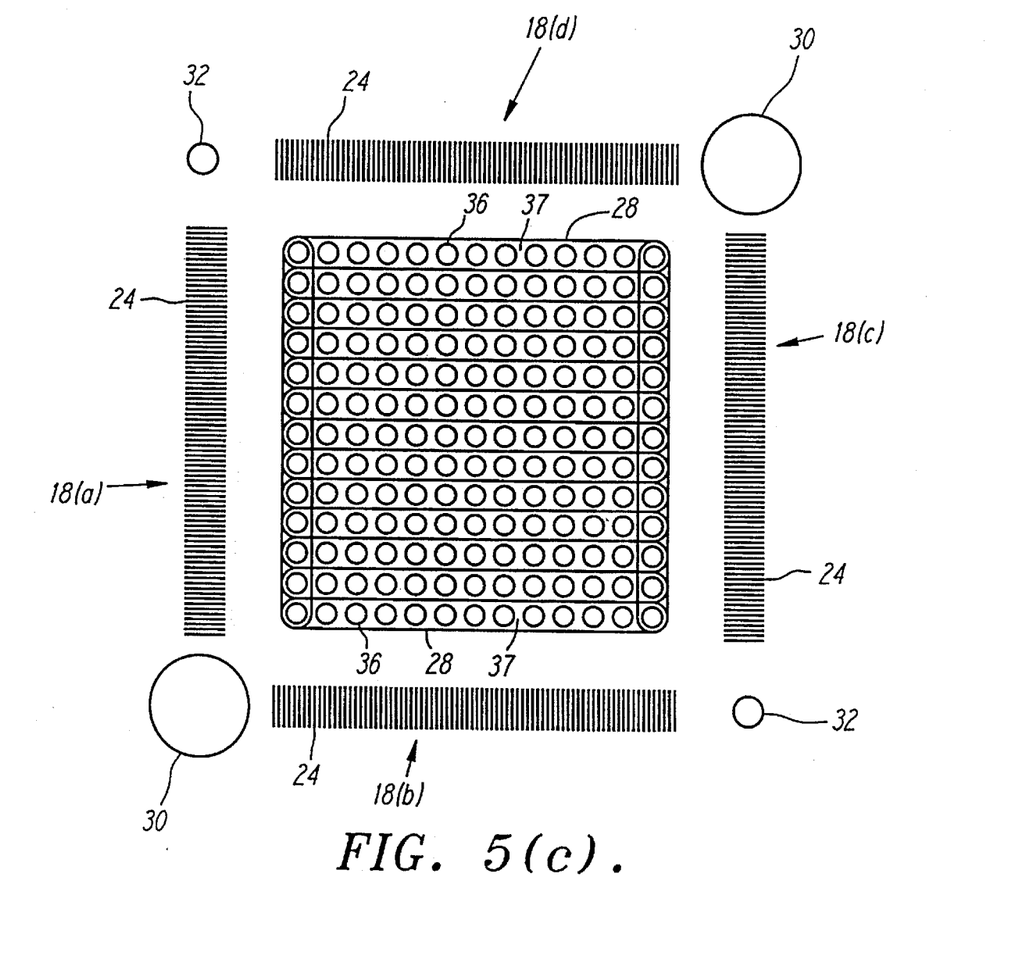

Turning now also to FIG. 5(c), in a preferred form a heat pad 28, a pair of fiducials 30, and a pair of mounting holes 32 may be formed within the TCP footprint portion of the dual footprint 14. The heat pad 28 may be disposed within the dual footprint 14 to allow heat to pass through the PC board 22 to a heat sink 34 (shown in FIG. 7). The heat pad 28 may comprise 169 copper plated holes 36 formed through the PC board 22. The copper plated holes 36 are tied to internal ground layers (not shown) of the PC board 22, and each plated hole 36 is formed to a 0.013" finished drill diameter. In addition, the heat pad area 37 formed upon the surface of the PC board may comprise exposed copper. A heat sink 34 (shown in FIG. 7) may be coupled to the PC board 22 and, more particularly, to the heat pad 30 in a conventional fashion using the mounting holes 32. For example, the heat sink may be bolted to the heat pad 28 using a pair of mounting bolts (not shown). The heat sink 34 may also be glued to the heat pad 30.

Figure 7:
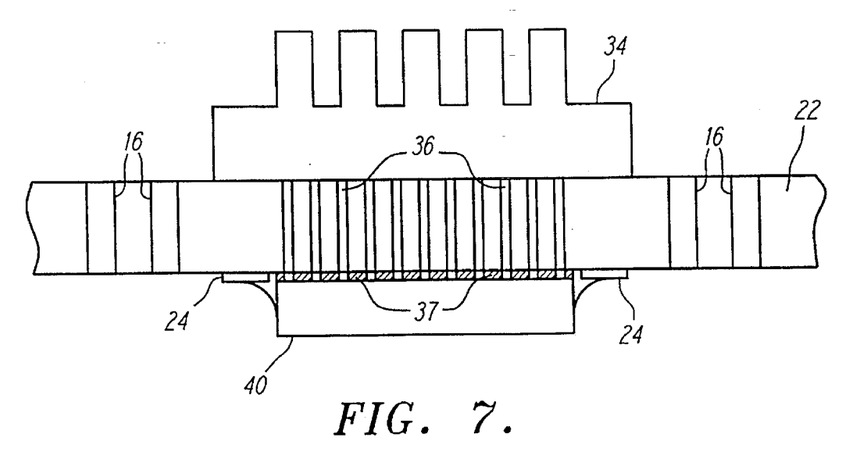
FIG. 7 is a cross-sectional view of a TCP package disposed within a dual footprint in accordance with the present invention.

Now turning to FIGS. 6 and 7, either a PGA type microprocessor package 38 or a TCP type microprocessor package 40 may be coupled to the PC board 22 via the dual footprint 14 in a conventional fashion. For example, in the case of a PGA type microprocessor package 38 the pins 42 of the PGA package 38 may be inserted into the pin receptors 16 of the dual footprint 14. In the case of a TCP type microprocessor package 40, the TCP package 40 is positioned by conventional means using pick and place imaging equipment upon the TCP footprint land areas of the dual footprint 14, and the TCP package is then hot bar bonded to the land areas.

It may be noted that, when a TCP type microprocessor package 40 is mounted to a PC board using a dual footprint 14 in accordance with the present invention, it may be advantageous to mount the TCP package 40 to one side of the PC board 22 and a heat sink 34 to the other side of the PC board 22, as shown in FIG. 7. In this fashion, sufficient heat dissipation may be achieved, while minimizing the height of components mounted to the PC board. In contrast, if height restrictions do not weigh heavily in the design criteria governing the layout of a PC board 22, or if a PGA type microprocessor package 38 is employed, it may be satisfactory to mount a heat sink 34 upon the dorsal surface 44 of the PGA package 38, as shown in FIG. 6.

Finally, with regard to the manufacture of PC boards including one or more dual footprints 14 in accordance with the present invention, it may be noted that conventional board construction techniques may be employed to create such boards. More specifically, it is well known in the art to submit film board layers (similar to the illustrations of FIGS. 3, 4, 5(*a*) and 5(*b*)) to a PC board manufacturer, such as Details, Inc., of Anaheim, Calif., and to have the PC board manufacturer manufacture a selected number of PC boards based upon the submitted film board layers (or specifications). For this reason, the precise steps of manufacturing a PC board are not set forth herein, as those steps are considered to be well known in the art.

While the invention of the subject application is susceptible to various modifications and alternative forms, specific examples thereof have been shown by way of example in the drawings and are herein described in detail. It should be understood, however, that the invention is not to be limited to the particular forms or methods disclosed, but to the contrary, the invention is to cover all modifications, equivalents, and alternatives falling within the spirit and scope of the appended claims.

What is claimed is:

1. A dual footprint for a PC board comprising:

a pin grid array footprint; and a tape carrier package footprint formed within said pin grid array footprint, wherein said tape carrier package footprint is offset at a selected angle greater than 0° from said pin grid array footprint.

2. The dual footprint of claim 1 wherein said offset angle is 10°.

3. The dual footprint of claim 1 wherein said pin grid array footprint is formed on one side of a PC board, and said tape carrier package footprint is formed on another side of said PC board.

4. The dual footprint of claim 1 wherein said tape carrier package footprint and said pin grid array footprint are interconnected by conductor traces formed within only two layers of said PC board.

5. The dual footprint of claim 1 further comprising a heat pad disposed within said tape carrier package footprint.

6. A dual footprint for a PC board comprising:

a pin grid array footprint;

a tape carrier package footprint disposed within said pin grid array footprint; and a plurality of conductor traces interconnecting said pin grid array footprint and said tape carrier package footprint such that said dual footprint is capable of receiving and servicing either a pin grid array type microprocessor packaging system or a tape carrier package type microprocessor packaging system.

7. The dual footprint of claim 6 wherein said tape carrier package footprint is offset at a selected angle from said pin grid array footprint.

8. The dual footprint of claim 6 wherein said offset angle is 10°.

9. The dual footprint of claim 6 wherein said tape carrier package footprint and said pin grid array footprint are interconnected by conductor traces formed within only two layers of said PC board.

10. A board for use in a personal computer, said board comprising:

a first board layer having a plurality of pin receptors and a plurality of vias extending therethrough and having a plurality of land patterns formed thereon, each land pattern comprising a plurality of parallel exposed conductor trace segments; said plurality of pin receptors comprising a footprint for a pin grid array microprocessor package; said plurality of land patterns comprising a footprint for a tape carrier package microprocessor package; and said tape carrier package footprint being disposed within said pin grid array footprint;

a second board layer having a plurality of pin receptors and a plurality of vias extending therethrough, said pin receptors and said vias of said second board layer being coextensive with said pin receptors and vias of said first board layer; and a plurality of conductor traces formed upon said first and second board layers and interconnecting selected ones of said pin receptors, selected ones of said exposed conductor trace segments, and selected ones of said vias, such that said pin grid array and tape carrier package footprints combine to form a dual footprint capable of servicing either a tape carrier package type microprocessor packaging system or a pin grid array type microprocessor packaging system.

11. The board of claim 10 further comprising a pairs of alignment fiducials formed upon said first board layer and being disposed within said tape carrier package footprint at a selected pair of opposite corner locations within said tape carrier package footprint.

12. The board of claim 11 further comprising a heat pad formed within said first and second board layers and being disposed within said tape carrier package footprint.

13. The board of claim 12 wherein said heat pad comprises:

a plurality of copper plated holes formed in and extending through said first and second board layers, said copper plated holes being coupled to a plurality of ground lines disposed within said first and second board layers; and a pair of surface pad areas of exposed copper covering an exterior surface of said first and second board layers, each surface pad area having a plurality of holes corresponding to said copper plated holes of said first and second board layers formed therein.

14. A microprocessor package receptor for use on a PC board, said microprocessor package receptor comprising:

a plurality of pin receptors formed through said PC board and disposed around a periphery of a first substantially square area on said PC board, said plurality of pin receptors comprising a footprint for a pin grid array type microprocessor package;

four land patterns disposed on said PC board within said first substantially square area, said land patterns comprising a footprint for a tape carrier package type microprocessor package, each land pattern comprising a plurality of exposed parallel conductor traces, and each land pattern being disposed along a separate edge of a second substantially square area on said PC board, said second substantially square area being offset from said first substantially square area by a selected angle; and a plurality of conductor traces interconnecting selected ones of said pin receptors with selected ones of said parallel exposed conductor traces comprising said land patterns, such that a dual footprint is formed capable of servicing either a pin grid array type microprocessor package or a tape carrier package type microprocessor package.

15. The microprocessor package receptor of claim 15 wherein said selected angle is 10°.

16. A dual footprint comprising:

a first footprint formed on a PC board for receiving and servicing a first type of microprocessor package; and a second footprint formed on said PC board and disposed within said first footprint for receiving and servicing a second type of microprocessor package, wherein said first footprint and said second footprint are offset by an angle greater than 0°.

17. The dual footprint of claim 16 wherein said first footprint comprises a pin grid array footprint and said second footprint comprises a tape carrier package footprint.

18. The dual footprint of claim 17 wherein said selected angle is 10°.

19. A method of providing a tape carrier package footprint and a pin grid array package footprint on a PC board while minimizing a consumption of board space, said method comprising the steps of:

forming a pin grid array footprint on said PC board; and forming within said pin grid array footprint on said PC board a tape carrier package footprint, wherein said tape carrier package footprint is formed at a selected angle greater than 0° relative to said pin grid array footprint.

20. The method of claim 19 further comprising the step of providing conductor traces between said pin grid array footprint and said tape carrier package footprint such that said pin grid array and tape carrier package footprints form a single dual footprint capable of servicing either a pin grid array microprocessor packaging system or a tape carrier package microprocessor packaging system.

21. A method of minimizing a number of vias and board layers required to interconnect a pin grid array footprint and a tape carrier package footprint disposed on a PC board, said method comprising the steps of:

forming said tape carrier package footprint within said pin grid array footprint; and offsetting said tape carrier package footprint from said pin grid array footprint by a selected angle greater than 0°.

22. The method of claim 21 wherein said selected angle is 10°.

23. A dual footprint comprising:

first receptor means formed on a PC board for receiving and providing an electrical interconnection to a first type of microprocessor package, said first receptor means defining a perimeter region on said PC board;

second receptor means formed on said PC board for receiving and providing an electrical interconnection to a second type of microprocessor package, said second receptor means being disposed within said perimeter region of said first receptor means; and electrical interconnect means coupling said first receptor means to said second receptor means.

24. The dual footprint of claim 23 wherein said second receptor means is offset at a selected angle in relation to said first receptor means.

25. The dual footprint of claim 24 wherein said selected angle is 10°.

26. The dual footprint of claim 23 wherein said first and second receptor means are disposed on opposite sides of said PC board.

27. A dual footprint for a PC board comprising:

a pin grid array footprint; and a tape carrier package footprint formed within said pin grid array footprint, wherein said pin grid array footprint is formed on one side of said PC board, and said tape carrier package footprint is formed on another side of said PC board.

28. A dual footprint for a PC board comprising:

a pin grid array footprint; and a tape carrier package footprint formed within said pin grid array footprint, wherein said tape carrier package footprint and said pin grid array footprint are interconnected by conductor traces formed within only two layers of said PC board.

29. A dual footprint for a PC board comprising:

a pin grid array footprint;

a tape carrier package footprint formed within said pin grid array footprint; and a heat pad disposed within said tape carrier footprint;

wherein said tape carrier package footprint is offset at a selected angle from said pin grid array footprint, such that a reduced number of vias and line layers are required within said PC board to interconnect said tape carrier package footprint and said pin grid array footprint.

30. A method of providing a tape carrier package footprint and a pin grid array footprint on a PC board while minimizing a consumption of board space, said method comprising the steps of:

forming a pin grid array footprint on said PC board;

forming within said pin grid array footprint on said PC board a tape carrier package footprint, said tape carrier package footprint being formed at a selected angle relative to said pin grid array footprint; and providing conductor traces between said pin grid array footprint and said tape carrier package footprint such that said pin grid array footprint and tape carrier package footprint form a single dual footprint capable of servicing either a pin grid array microprocessor packaging system or a tape carrier package microprocessor packaging system.

31. A dual footprint for a PC board comprising:

a pin grid array footprint;

a tape carrier package footprint formed within said pin grid array footprint; and a plurality of conductor traces interconnecting said pin grid array footprint and said tape carrier package footprint such that said pin grid array footprint and tape carrier package footprint form a single dual footprint capable of servicing either a pin grid array microprocessor packaging system or a tape carrier package microprocessor packaging system.

32. A method of providing a tape carrier package footprint and a pin grid array footprint on a PC board while minimizing a consumption of board space, said method comprising the steps of:

forming a pin grid array footprint on said PC board;

forming within said pin grid array footprint on said PC board a tape carrier package footprint; and providing conductor traces between said pin grid array footprint and said tape carrier package footprint such that said pin grid array footprint and tape carrier package footprint form a single dual footprint capable of servicing either a pin grid array microprocessor packaging system or a tape carrier package microprocessor packaging system.

* * * * *

UNITED STATES PATENT AND TRADEMARK OFFICE
CERTIFICATE OF CORRECTION

PATENT NO. : 5,557,505
DATED : September 7, 1996
INVENTOR(S) : David J. Silva

It is certified that error appears in the above-identified patent and that said Letters Patent is hereby corrected as shown below:

<u>Column 7</u>
Line 15, change "of claim 15" to --of claim 14--.

Signed and Sealed this

Third Day of July, 2001

Attest:

*Nicholas P. Godici*

NICHOLAS P. GODICI
*Attesting Officer*    *Acting Director of the United States Patent and Trademark Office*